United States Patent [19]
Van Dalfsen et al.

[11] Patent Number: 5,892,695
[45] Date of Patent: Apr. 6, 1999

[54] SAMPLE RATE CONVERSION

[75] Inventors: Age J. Van Dalfsen; Jeroen H. J. C. Stessen; Johannes G. W. M. Janssen, all of Eindhoven, Netherlands

[73] Assignee: U.S. Philips Corporation, New York, N.Y.

[21] Appl. No.: 959,348

[22] Filed: Oct. 28, 1997

[30] Foreign Application Priority Data

Oct. 31, 1996 [EP] European Pat. Off. .............. 96203035

[51] Int. Cl.$^6$ ..................................................... G06F 17/17
[52] U.S. Cl. ....................................................... 364/724.1
[58] Field of Search ...................... 364/724.011, 724.012, 364/724.1, 724.13, 724.16, 724.17; 345/475; 348/538, 441; 382/298, 299, 300

[56] References Cited

U.S. PATENT DOCUMENTS 5,023,825   6/1991   Luthra et al. ....................... 364/724.1
5,182,633   1/1993   Antonio et al. ...................... 348/441
5,351,087   9/1994   Christopher et al. ................ 348/441
5,808,924   9/1998   White .................................. 364/724.1

*Primary Examiner*—Chuong Dinh Ngo
*Attorney, Agent, or Firm*—Edward W. Goodman

[57] ABSTRACT

A filter device for changing a sample rate of a discrete representation, e.g., to change a size of an image signal (I), includes a plurality of multipliers (Mi), summing circuitry (Ai) coupled to outputs of the multipliers (Mi), and a plurality of delay cells (Di) arranged for repeatedly supplying identical values to corresponding ones of the multipliers (Mi) during a number of times corresponding to an expansion ratio by which the discrete representation (I) is to be expanded, or for, in cooperation with the summing circuitry (Ai, Ai'), accumulating output values from the multipliers (Mi) during a number of times corresponding to a compression ratio by which the discrete representation (I) is to be compressed.

4 Claims, 1 Drawing Sheet

SAMPLE RATE CONVERSION

BACKGROUND OF THE INVENTION

1. Field of the Invention

The invention relates to a filter device for changing a sample rate of a discrete representation, e.g., to change a size of an image signal, and to an image display apparatus comprising such a filter device.

2. Description of the Related Art

With the advent of computer technology in the consumer electronics area by means of, e.g., internet, games and video conferencing, it is likely that the display technologies of television and computers are going to merge. As a result of this emerging trend, the desire for improved quality in TV images will increase, because the spatial resolution of PC-based synthetic images outperforms those of natural video scenery. Furthermore, in these state-of-the-art consumer electronics products, a need for high quality image scalers arises. Until now, sampling rate converters were more or less dedicated and optimized to perform one function, e.g., size conversion for Picture In-Picture (PIP). This leads to products in which sampling rate converters, tuned for different applications, are scattered. We foresee a need for a more flexible high quality scaler that can be used for a range of functions, not only to allow new advanced scaling features, but also to be able to handle different picture formats and display types. One could think of PIP, split-screen, multi-window features, high quality size conversion of graphics and video, and size adaptation for LCD or plasma displays.

U.S. Pat. No. 5,383,145 discloses direct type and inverted type digital FIR filters. When such FIR filters are used for compression, i.e., for decreasing the size of an image signal, too many samples are obtained as such a FIR filter calculates one output sample for each input sample. This means that at the output, some of the output samples have to be discarded, which implies a waste of calculation resources used to obtain these discarded samples. Moreover, there is no indication as to how an expansion is to be effectuated.

SUMMARY OF THE INVENTION

It is, inter alia, an object of the invention to provide an improved sample rate conversion. To this end, a first aspect of the invention provides a filter device for changing a sample rate of a discrete representation, the filter device comprising a plurality of multipliers; summing means coupled to outputs of said plurality of multipliers; and a plurality of delay cells arranged for repeatedly supplying identical values to corresponding ones of said multipliers during a number of times corresponding to an expansion ratio by which said discrete representation is to be expanded, or for, in cooperation with the summing means, accumulating output values from said multipliers during a number of times corresponding to a compression ratio by which said discrete representation is to be compressed. A second aspect of the invention provides an image display apparatus comprising such a filter device.

A filter device for changing a sample rate of a discrete representation, e.g. to change a size of an image signal, in accordance with a primary aspect of the invention comprises a plurality of multipliers, summing circuitry coupled to outputs of the multipliers, and a plurality of delay cells arranged for repeatedly supplying identical values to corresponding ones of the multipliers during a number of times corresponding to an expansion ratio by which the discrete representation is to be expanded, or for, in cooperation with the summing circuitry, accumulating output values from the multipliers during a number of times corresponding to a compression ratio by which the discrete representation is to be compressed. Herein, expansion is synonymous to up-sampling, and compression is synonymous to down-sampling. While in this specification, the sample rate conversion filter device of the present invention is elucidated by means of the example of an image size changer, other discrete representations, like digital or time-discrete sound, and designs of character fonts, textiles or wallpaper patterns, are by no means excluded.

By means of the filter device in accordance with the present invention, no input samples are skipped in the case of a compression, as the circuit processes all input samples which are presented. Reversely, in the case of an expansion, the delay cells repeatedly furnish samples to the multipliers, thereby generating the basis for obtaining additional output samples. The invention encompasses filter devices which are only suitable for compression, filter devices which are only suitable for expansion, as well as reconfigurable filter devices which are suitable for both compression and expansion.

These and other aspects of the invention will be apparent from and elucidated with reference to the embodiments described hereinafter.

DESCRIPTION OF THE PREFERRED EMBODIMENTS

Figure 1:
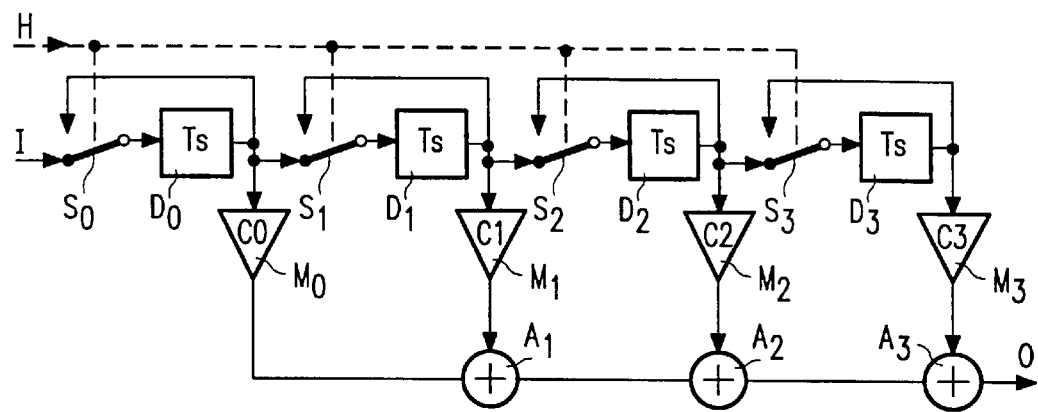
FIG. 1 shows an embodiment of an expansion filter in accordance with the present invention.

FIG. 1 shows an embodiment of an expansion filter in accordance with the present invention and illustrates how the normal (polyphase) FIR filter structure is modified to allow for expansion. In case of expansion, there are more output samples than there are input samples.

In FIG. 1, an input signal I is applied to a first delay unit (S0, D0) which comprises a switch S0 and a delay cell D0. The switch S0 applies either the input signal I or an output signal of the delay cell D0, to the delay cell D0. The switch S0 is controlled by a hold signal H. The delay cell D0 imposes a delay of one sampling period Ts. Obviously, other implementations of the first delay unit (S0, D0) are possible as well: a delay cell with a write-enable input receiving the hold signal H would do. A cascade connection of delay units (S1, D1), (S2, D2), and (S3, D3), each having a similar construction as the first delay unit (S0, D0), is connected to the output of the delay cell D0. Multipliers M0, M1, M2, and M3 multiply the output signals of the delay cells D0, D1, D2, and D3, respectively, by (variable) coefficients C0, C1, C2, and C3, respectively. With variable coefficients C0–C3, a polyphase filter is obtained. Adders A1, A2, and A3 sum the outputs of the multipliers M0, M1, M2, and M3, to furnish an output signal O.

For effectuating an expansion ratio of, e.g., 1:4, the hold signal puts the switches Si in the state shown during a first sampling period, and then in the state not shown for the following three successive sampling periods. This means that each input sample is supplied four times by the delay cells Di. Preferably, the filter device is a polyphase filter, in which the coefficients Ci are different for each sampling period Ts.

Sometimes, only the fractional part of the delay changes. In that case, the delay units (Si, Di) do not shift, only the coefficients Ci of the filter are changed. A new output sample will be calculated from the same input sample data set (same integer delay). Infinite expansion is permitted, without any special measures.

Figure 2:
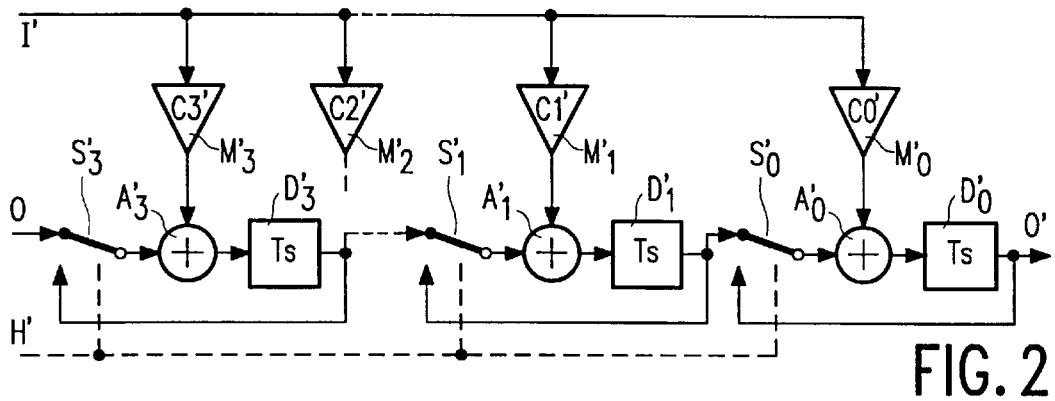
FIG. 2 shows an embodiment of a compression filter in accordance with the present invention.

FIG. 2 shows an embodiment of a compression filter in accordance with the present invention. In case of compression, there are (far) fewer output samples than there are input samples. This is downsampling or decimation. According to the sampling theorem, the bandwidth of the interpolation filter must be reduced to fit the lowest of the two sample rates, in this case the output sample rate. Unfortunately, in a conventional FIR filter implementation, the filter is constant, i.e., it is related to the input side (where the sample rate is constant). Compression or downsampling means losing samples, thus losing information, and thus aliasing. With a conventional FIR filter interpolator, a low-pass pre-filter ("anti-aliasing filter") is required to fulfill the sampling theorem requirement. As the compression rate is increased, the pre-filter bandwidth must be decreased. This makes it very awkward to apply the conventional FIR filter interpolator implementation for variable compression like, e.g., geometry correction. A variable compression rate requires a variable pre-filter. Another solution is needed.

In accordance with an aspect of the present invention, input and output are reversed to make the filter device an "input-driven" interpolator: for every input sample one calculation is performed and the result is distributed (accumulated) over a set of output samples. In case of compression, every input sample gets processed, so no information is ever lost! Not much aliasing will result from compression. FIG. 2 illustrates how the inverted FIR filter structure must be modified to allow for good compression.

In FIG. 2, an input signal I' is applied to multipliers M3', M2', M1', and M0' for multiplication by respective factors C3', C2', C1', and C0'. Outputs of the multipliers M3', M1', and M0' are coupled to accumulator units (S3', A3', D3'), (S1', A1', D1'), and (S0', A0', D0'). Each accumulator unit (Si', Ai', Di') comprises a switch Si', an adder Ai', and a delay cell Di'. The switch Si' applies either an output signal of the previous accumulator unit (for switch S3': a zero value) or an output signal of the delay cell Di', to the adder Ai'. The adder Ai' adds the signal received from the switch Si' to the output of the multiplier Mi', and applies the sum to the delay cell Di'. The last delay cell D0' furnishes the output signal O' of the filter device of FIG. 2. The switches Si' are controlled by a hold signal H'. For a compression ratio of, e.g., 4:1, the hold signal H' keeps the switches Si' in the state shown for one sample period Ts, and in the state not shown for the following three successive sampling periods.

Sometimes, only the fractional part of the delay changes. In that case, the delay cells Di' do not shift, only the coefficients Ci of the filter are changed. A new input sample will be used to calculate its contribution to the same output sample data set (same integer delay). This output is accumulated with the other contents of the delay cells. Only when the integer part of the delay (or destination address) changes, then the storage elements shift the data out (one at a time).

Essentially, the calculation rate must be coupled to the side (input or output) with the highest sample rate (for compression: the input) and the filter bandwidth must be coupled to the side with the lowest sample rate (for compression: the output). This is the exact purpose of the reversal of input and output. Very high compression rates can be achieved without pre-filtering.

Figure 3:
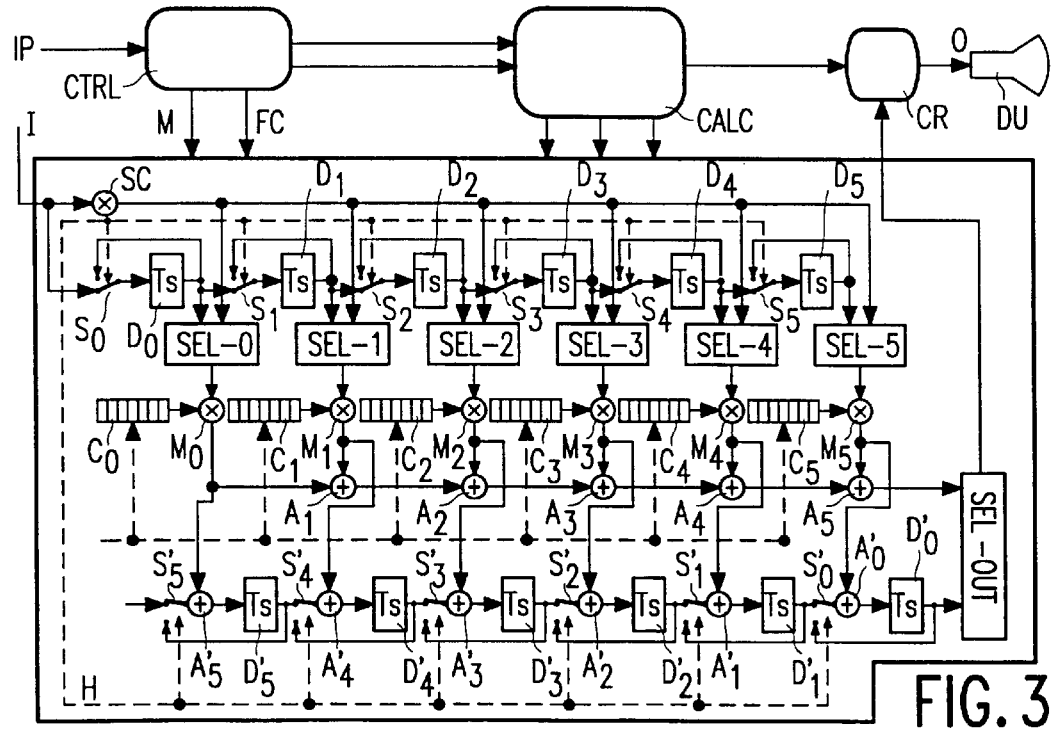
FIG. 3 shows an embodiment of an image display device comprising a filter device in accordance with the present invention which is suitable for both compression and expansion.

FIG. 3 shows an embodiment of an image display device comprising a filter device in accordance with the present invention which is suitable for both compression and expansion. Basically, FIG. 3 is a combination of FIGS. 1 and 2, suitable for both compression and expansion. The input signal I is applied to a cascade connection of delay units (S0, D0) . . . (S5, D5) as in FIG. 1. Outputs of the delay cells Di are applied to multipliers M0 . . . M5 thru selectors SEL-0 . . . SEL-5. The multipliers Mi multiply by variable coefficients C0 . . . C5 selected from coefficient arrays or obtained from a function generator (not shown); there are preferably 64 different coefficients in each array, which coefficients are selected by means of a phase signal Ph. Outputs of the multipliers M0 . . . M5 are summed by adders A1 . . . A5 to obtain a result which is applied to a first input of an output selector SEL-out.

The input signal I is also applied to second inputs of the selectors SEL-0 . . . SEL-5 thru a scaler SC. The outputs of the multipliers Mi are also applied to accumulation units (Si', Ai', Di') as in FIG. 2. The output of the delay cell D0' is applied to a second input of the output selector SEL-out.

When the input signal I is to be expanded, the selectors SEL-i pass the outputs of the delay cells Di to the multipliers Mi, as in FIG. 1, and the output selector SEL-out selects its first input signal, i.e., the output of the adder A5. When the input signal I is to be compressed, the selectors SEL-i pass the output of the scaler SC directly to the multipliers Mi, as in FIG. 2, and the output selector SEL-out selects its second input signal, i.e., the output of the delay cell D0'.

The filter device of FIG. 3 further comprises a control, initialization and mode select unit CTRL which determines a mode signal (compression/expansion) M and filter coefficients Fc on the basis of received input parameters IP. A calculation unit CALC determines a zoom factor, the coefficient phase signal Ph, and the hold signal H which determines the states of the switches Si, Si', from data received from the control unit CTRL. The calculation unit CALC also controls a clip-and-round circuit which furnishes the output signal of the filter device on the basis of the output signal of the output selector SEL-out. The output signal O is displayed on a display unit DU.

Preferably, only one set of delay cells is used for the delay cells Di and Di' by means of appropriate switching.

It should be noted that the above-mentioned embodiments illustrate rather than limit the invention, and that those skilled in the art will be able to design many alternative embodiments without departing from the scope of the appended claims. A vertical expansion or compression is achieved if the delay imposed by the delay cells equals a line period of the image signal. The invention can be implemented by means of hardware comprising several distinct elements, and by means of a suitably programmed computer.

What is claimed is:

1. A filter device for changing a sample rate of a discrete representation, the filter device comprising:

a plurality of multipliers;

summing means coupled to outputs of said plurality of multipliers; and a plurality of delay cells arranged for repeatedly supplying identical values to corresponding ones of said multipliers during a number of times corresponding to an expansion ratio by which said discrete representation is to be expanded, or for, in cooperation with the summing means, accumulating output values from said multipliers during a number of times corresponding to a compression ratio by which said discrete representation is to be compressed.

2. A filter device as claimed in claim 1, wherein said multipliers are arranged for multiplying values applied to said multipliers by successive ones of a plurality of coefficients.

3. A filter device as claimed in claim 1, comprising a first set of delay cells coupled to inputs of corresponding ones of said multipliers in an expansion mode of said filter device, and a second set of delay cells coupled to outputs of corresponding ones of said multipliers in a compression mode of said filter device.

4. An image display apparatus, comprising:

a filter device for changing a sample rate of a discrete representation, the filter device comprising a plurality of multipliers; summing means coupled to outputs of said plurality of multipliers; and a plurality of delay cells arranged for repeatedly supplying identical values to corresponding ones of said multipliers during a number of times corresponding to an expansion ratio by which said discrete representation is to be expanded, or for, in cooperation with the summing means accumulating output values from said multipliers during a number of times corresponding to a compression ratio by which said discrete representation is to be compressed, said filter device furnishing a compressed or expanded image signal, wherein said discrete representation is a sampled input image signal; and a display device for displaying said compressed or expanded image signal.

\* \* \* \* \*